(12) United States Patent
Nagamine et al.

(10) Patent No.: US 9,017,535 B2
(45) Date of Patent: Apr. 28, 2015

(54) HIGH-FREQUENCY SPUTTERING DEVICE

(75) Inventors: Yoshinori Nagamine, Tama (JP); Kanto Nakamura, Hopkins, MN (US); Koji Tsunekawa, Tokyo (JP)

(73) Assignee: Canon Anelva Corporation, Kawasaki-shi (JP)

( * ) Notice: Subject to any disclaimer, the term of this patent is extended or adjusted under 35 U.S.C. 154(b) by 663 days.

(21) Appl. No.: 12/727,316

(22) Filed: Mar. 19, 2010

(65) Prior Publication Data

US 2010/0213047 A1 Aug. 26, 2010

Related U.S. Application Data

(63) Continuation of application No. PCT/JP2008/065485, filed on Aug. 29, 2008.

(30) Foreign Application Priority Data

Oct. 4, 2007 (WO) .................. PCTJP/2007/069459
Aug. 25, 2008 (JP) ................................. 2008-215386

(51) Int. Cl.
*C23C 14/00* (2006.01)
*C25B 9/00* (2006.01)
(Continued)

(52) U.S. Cl.
CPC ............. *C23C 14/50* (2013.01); *C23C 16/4586* (2013.01); *C23C 14/352* (2013.01);
(Continued)

(58) Field of Classification Search
CPC .. C23C 14/50; C23C 14/352; C23C 16/4586; C23C 14/081; C23C 14/225; C23C 14/345; H01J 37/3417; H01J 37/3438; H01J 374/3444; H01L 43/12

USPC ......................... 204/298.08, 298.15; 118/728
See application file for complete search history.

(56) References Cited

U.S. PATENT DOCUMENTS 5,110,438 A * 5/1992 Ohmi et al. ............... 204/298.34
5,510,011 A    4/1996 Okamura et al. .......... 204/192.3
(Continued)

FOREIGN PATENT DOCUMENTS

CN   1755963 A   4/2006
JP   61-231172   10/1986
(Continued)

OTHER PUBLICATIONS

Chinese office action issued in counterpart application No. 200880110336.6, dated Apr. 6, 2011, along with its English-language translation—20 pages.

*Primary Examiner* — Michael Band
(74) *Attorney, Agent, or Firm* — Fitzpatrick, Cella, Harper & Scinto (57) ABSTRACT

Provided is a high-quality magnetoresistive thin film by using a method of controlling self bias of a high-frequency sputtering device. In order to control the self bias for the substrate by adjusting a substrate potential, the high-frequency sputtering device according to the present invention includes: a chamber; evacuation means for evacuating the inside of the chamber; gas introduction means for supplying a gas into the chamber; a substrate holder provided with a substrate mounting table; rotation drive means capable of rotating the substrate holder; a sputtering cathode provided with a target mounting table and arranged such that the surface of the target mounting table is non-parallel to the surface of the substrate mounting table; an electrode disposed inside the substrate holder; and a variable impedance mechanism electrically connected to the electrode, for adjusting the substrate potential on the substrate holder.

5 Claims, 9 Drawing Sheets

(51) Int. Cl.

| | | |
|---|---|---|
| *C25B 11/00* | (2006.01) | |
| *C25B 13/00* | (2006.01) | |
| *C23C 16/00* | (2006.01) | |
| *C23C 14/50* | (2006.01) | |
| *C23C 16/458* | (2006.01) | |
| *C23C 14/35* | (2006.01) | |
| *H01J 37/34* | (2006.01) | |
| *C23C 14/08* | (2006.01) | |
| *C23C 14/22* | (2006.01) | |
| *C23C 14/34* | (2006.01) | |
| *H01L 43/12* | (2006.01) | |

(52) U.S. Cl.
CPC ......... *H01J37/3417* (2013.01); *H01J 37/3438* (2013.01); *H01J 37/3444* (2013.01); *C23C 14/081* (2013.01); *C23C 14/225* (2013.01); *C23C 14/345* (2013.01); *C23C 14/3464* (2013.01); *H01L 43/12* (2013.01)

(56) References Cited

U.S. PATENT DOCUMENTS

| | | | | |
|---|---|---|---|---|
| 5,665,166 | A * | 9/1997 | Deguchi et al. | 118/723 E |
| 6,217,724 | B1 * | 4/2001 | Chu et al. | 204/192.37 |
| 6,602,384 | B2 * | 8/2003 | Bhardwaj et al. | 156/345.24 |
| 2002/0003086 | A1 * | 1/2002 | Sferlazzo | 204/298.11 |
| 2006/0056115 | A1 | 3/2006 | Djayaprawira et al. | 360/324.2 |
| 2006/0169582 | A1 * | 8/2006 | Brown et al. | 204/298.01 |
| 2007/0080059 | A1 | 4/2007 | Takahashi | 204/298.01 |
| 2008/0164547 | A1 | 7/2008 | Higo et al. | 257/421 |
| 2009/0032056 | A1 | 2/2009 | Tsunekawa | 134/1.3 |
| 2009/0211897 | A1 | 8/2009 | Tsunekawa | 204/192.13 |
| 2009/0261436 | A1 | 10/2009 | Maehara et al. | 257/421 |
| 2009/0321246 | A1 | 12/2009 | Tsunekawa et al. | 204/192.2 |
| 2010/0078310 | A1 | 4/2010 | Tsunekawa et al. | 204/192.2 |
| 2010/0080894 | A1 | 4/2010 | Tsunekawa et al. | 427/131 |
| 2010/0200394 | A1 * | 8/2010 | Nagamine et al. | 204/192.13 |

FOREIGN PATENT DOCUMENTS

| | | |
|---|---|---|
| JP | 06-145972 | 5/1994 |
| JP | 06-179968 | 6/1994 |
| JP | 08-302467 | 11/1996 |
| JP | 8302467 | 11/1996 |
| JP | 09-302464 | 11/1997 |
| JP | 2001-262336 | 9/2001 |
| JP | 2002-115051 | 4/2002 |
| JP | 2002-294441 | 10/2002 |
| JP | 2004-162138 | 6/2004 |
| JP | 2005-187860 | 7/2005 |
| JP | 2007-034686 | 2/2007 |
| JP | 2007-100183 | 4/2007 |
| JP | 2007-157840 | 6/2007 |

* cited by examiner

| LAYER | FILM THICKNESS (Å) |
|---|---|
| 517 — Ru | 70 |
| 516 — Ta | 50 |
| 515 — Cu | 300 |
| 514 — Ta | 80 |
| 513 — CoFeB | 30 |
| 512 — MgO | 10~16 |
| 511 — CoFeB | 30 |
| 510 — Ru | 9 |
| 509 — 70CoFe | 25 |
| 508 — IrMn | 70 |
| 507 — Ru | 50 |
| 506 — Ta | 30 |
| 505 — CuN | 200 |
| 504 — Ta | 30 |
| 503 — CuN | 200 |
| 502 — Ta | 50 |
| 501 — THERMALLY OXIDIZED SILICON SUBSTRATE | |

HIGH-FREQUENCY SPUTTERING DEVICE

CROSS-REFERENCES TO RELATED APPLICATIONS

This application is a continuation application of International Application No. PCT/JP2008/065485, filed on Aug. 29, 2008, the entire contents of which are incorporated by reference herein.

This application also claims the benefit of priorities from PCT International Application No. PCT/JP2007/069459 filed on Oct. 4, 2007 and Japanese Patent Application No. 2008-215386 filed on Aug. 25, 2008, the entire contents of which are incorporated herein by reference.

BACKGROUND OF THE INVENTION

1. Field of the Invention

The present invention relates to a high-frequency sputtering device for manufacturing a magnetic reproducing head of a magnetic disc driver, a storage element of a magnetic random access memory and a magnetic sensor, and a manufacturing method thereof.

2. Related Background Art

Since a tunnel magnetoresistive thin film using insulating film MgO as a tunnel barrier layer exhibits extremely high rate of magnetoresistance change of 200% or more at room temperature, application to a magnetic reproducing head and a storage element of MRAM is expected. In order to achieve high resolution of a magnetic head and high integration of MRAMs, there is demand for the size reduction of their elements, however, in order to ensure high speed transfer of data, it is indispensable to reduce junction resistance. Although, it is possible to reduce junction resistance by reducing the thickness of the tunnel barrier layer of MgO film, there has been a problem that the rate of magnetoresistance change is also reduced at the same time. The reason may be that crystalline orientation at an initial stage of growth of the MgO film has been disturbed.

Since plasma density in case of high-frequency sputtering is higher than that in case of DC sputtering, and a bias voltage in case of high-frequency sputtering is more easily applied to a structure contacting with plasma than in case of DC sputtering, positive ions accelerated by potential difference between the substrate and the plasma flow into a substrate more easily in case of high-frequency sputtering than in case of DC sputtering, Since the inflow of positive ions having this energy to the substrate promotes surface diffusion of sputtering atoms on the substrate, a high density and highly oriented film can be formed. However, if a bias potential on the substrate is too high, a problem that high energy positive ions damage a film during formation, will occur. That is, there is an optimum range of the substrate potential in order to form a high-quality thin film, thereby, it is important to control the range. Here, it is also necessary to consider that as an insulating film is deposited on a substrate the substrate potential changes gradually.

In Patent Document 1, a technology in which the potential of a substrate electrode with respect to an anode electrode can be changed by changing the value of variable resistance disposed to the substrate electrode in a high-frequency sputtering device, is disclosed. In Patent Document 2, a high-frequency sputtering device in which an electrode for controlling particles incident to a substrate is disposed between the substrate and a target, is disclosed.

Patent Document 1: Japanese Patent Laid Open No. 09-302464

Patent Document 2: Japanese Patent Laid Open No. 06-179968

SUMMARY OF THE INVENTION

However, a very thin film is demanded for a recent semiconductor device. Especially, since the thickness of crystalline insulating film MgO used for a tunnel barrier layer of a magnetoresistive thin film is very thin, the insulating film has to be grown in a highly oriented manner from an initial stage of its growth. For this reason it is important to intentionally control a substrate bias potential that changes as an insulating film is gradually deposited on the substrate, so that the bias potential is suppressed within such a potential range that promotes surface diffusion of sputtering atoms on the substrate surface and does not damage the film. The object of the present invention is to produce a magnetoresistive thin film in which low junction resistance is attained while a high rate of magnetoresistance change is maintained by adjusting the substrate potential so that self bias with respect to a substrate is controlled to give good crystalline orientation from an initial stage of growth of an insulating film.

In order to attain the above-mentioned object, a high-frequency sputtering device according to the present invention includes: a chamber; evacuation means for evacuating the inside of the chamber; gas introduction means for supplying a gas into the chamber; a substrate holder provided with a substrate mounting table; rotation drive means capable of rotating the substrate holder; a sputtering cathode provided with a target mounting table and arranged such that the surface of the target mounting table is non-parallel to the surface of the substrate mounting table; an electrode disposed inside the substrate holder; and a variable impedance mechanism electrically connected to the electrode, for adjusting the substrate potential on the substrate holder. By disposing the variable impedance mechanism to the substrate holder, the stage potential during insulator film formation is adjusted and optimized.

According to the high-frequency sputtering device which controls the magnitude of self-bias applied on a substrate by the variable impedance mechanism of the present invention, a magnetoresistive thin film having low junction resistance while maintaining a high rate of magnetoresistance change, can be produced.

REFERENCE NUMERALS

1 High-frequency sputtering device
3 Substrate holder
4 Variable impedance mechanism
8 Vdc arithmetic circuit
9 Impedance control section
10 Input detector
11 High-frequency power supply

DESCRIPTION OF THE EMBODIMENTS

First Embodiment

Figure 1A:
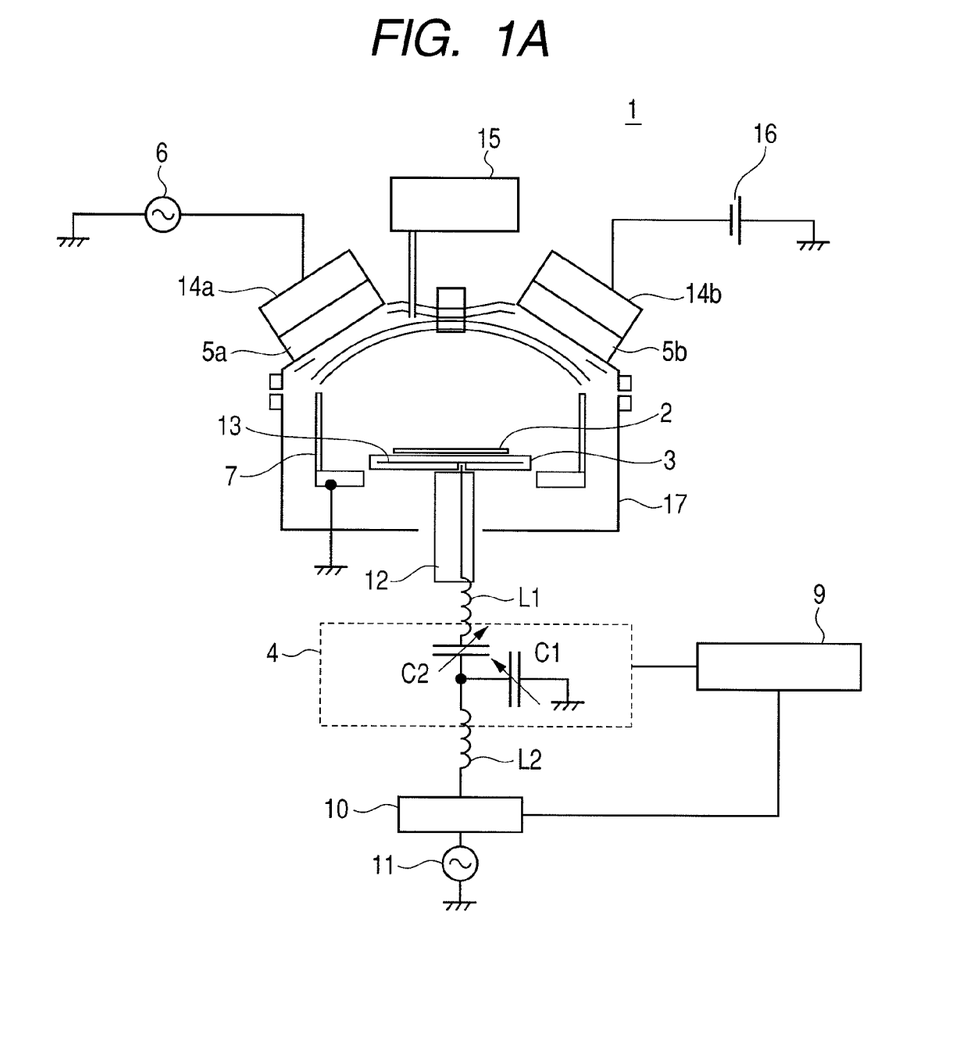
FIG. 1A is a diagram illustrating a first embodiment of a high-frequency sputtering device according to the present invention.

FIG. 1A is a schematic view of a high-frequency sputtering device 1 exhibiting the feature of the present invention. With reference to FIG. 1A, the configuration of the high-frequency sputtering device 1 to which the present invention can be applied, will be described. The sputtering device 1 includes sputtering cathodes 14a and 14b, each provided with a target mounting table. A target 5a and a target 5b are mounted on the target mounting tables of the cathode 14a and the cathode 14b, respectively. In the present embodiment, the target 5a is an insulator MgO target and the target 5b is a metal Ta target, and however the targets can be suitably altered by a user. The cathode 14a is connected to a grounded high-frequency power supply 6 via a blocking capacitor (not illustrated in the figure). Here, the high-frequency power supply 6 is referred to as such a power supply that can supply power of 200 to 1000 W. The other cathode 14b is connected to a grounded DC power supply 16. The high-frequency sputtering device 1 further includes a substrate holder 3 provided with a substrate mounting table for mounting a substrate 2 to be subjected to sputtering processing, and a metal shield 7 disposed along the sides of the sputtering device 1 so as to prevent sputtering particles emitted from the targets 5 from adhering to a vacuum chamber 17. Each of the surfaces of target mounting tables of the cathodes 14a and 14b is arranged to be non-parallel to the surface of the substrate mounting table of the substrate holder 3. Here, it is preferable for the diameter of each of the targets 5a and 5b to be equal to or smaller than that of the substrate holder 3.

The substrate holder 3 is provided with a rotation drive section 12 which rotationally drives the substrate holder 3. A variable impedance mechanism 4 is electrically connected to an electrode 13 disposed inside the substrate holder 3. The variable impedance mechanism 4 includes an impedance matching circuit made of combination of capacitors C and coils L. Moreover, to the variable impedance mechanism 4, an impedance control section 9 is connected, and a high-frequency power supply 11 is connected via an input detector 10. The control circuit 9 and the input detector 10 are electrically connected to each other. A gas such as Ar is supplied inside the chamber 17 by a gas supply device 15. Although not illustrated in the figure, the sputtering device 1 also includes gas evacuation means for evacuating a gas inside the chamber 17.

Figure 1B:
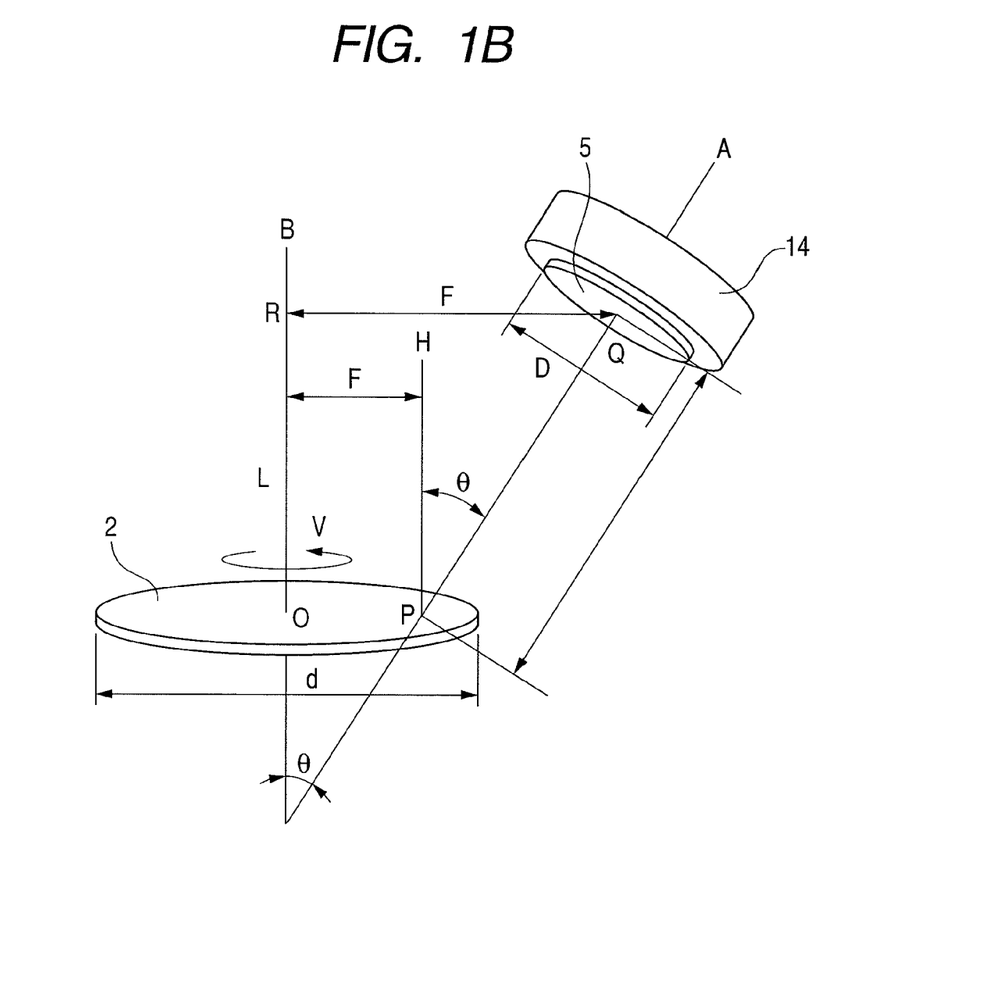
FIG. 1B is a diagram illustrating a method of forming a film using a high-frequency sputtering device according to the present invention.

Now, with reference to FIG. 1B, a method of forming a film using a high-frequency sputtering device will be described. In the high-frequency sputtering device 1 used in the present embodiment, a substrate 2 with a diameter of d rotating at a suitable speed V rotates at a rotation number of V. A sputtering cathode 14 and a target 5 (5a, 5b) are installed such that the central axis line A of the target 5 having a diameter D mounted on the sputtering cathode 14 is tilt by an angle θ with respect to the central normal line B of the substrate 2. The intersection point between the central axis line A of the target 5 and the target 5, namely, the central point of the target 5, is designated as Q. If the intersection point between a line parallel to the substrate surface and passing through Q and the central normal line B of the substrate 2 is designated as R, and the center of the substrate 2 is designated as O, the line segment OR can be defined as distance L, and the line segment RQ can be defined as offset distance F. The numerical values of the ratio of the diameter d of the substrate 2 to the diameter D of the target 5, the angle θ and the distances F and L are set as follows. Note that, in FIG. 1B only one target is illustrated, however, the target 5 represents the targets 5a and 5b in FIG. 1A. The surfaces of targets 5a and 5b are arranged to be non-parallel so as to face the substrate, respectively.

The rotation number V of the substrate 2, the angle θ, the distance F, and the distance L are configured so as to satisfy the following conditions, respectively: V=100 rpm; 15°=θ=45°; 50 mm=F=400 mm; and 50 mm=L=800 mm. In the following embodiments, V, θ, F and L were set to be 100 rpm, 30°, 250 mm, and 346.6 mm, respectively.

During film formation, the pressure inside the vacuum chamber 17 is maintained to be approximately equal to or smaller than $10^{-7}$ Pa in order to form a film without including impurities into the thin film. If Ar gas is introduced inside the vacuum chamber 17 by the gas supply device 15, and high-frequency power (10 to 100 MHz) is applied to the cathode 14a by the high-frequency power supply 6, plasma is generated inside the vacuum chamber 17. Ar ions extracted from the plasma bombard the target 5a to form an MgO film on the substrate 2 as sputtering particles. In addition, since the substrate holder 3 is rotated during sputtering at given number of rotations (100 rpm) by a rotation drive section 12, even if an oblique sputtering method is used, uniform MgO film can be formed.

As described above, by arranging respective surfaces of the substrate holder and the target to be non-parallel to each other, and by causing the above described distance L to be a predetermined value or more, the rate of film formation can be reduced, thereby enabling ultra thin MgO film to be formed accurately and reproducibly.

As mentioned above, when performing sputtering by applying high-frequency power to the insulator (MgO) target 5a, the substrate holder 3 having a floating potential is easily charged to a negative voltage due to generation of plasma. For this reason, self-bias acts on the substrate 2, and Ar positive ions originating from plasma are accelerated by the potential difference between the positive potential of the plasma and the negative potential of the substrate and flows into the substrate 2. However, in order to form a high-quality ultra-thin film, an optimal range exists in the bias potential. Since the plasma potential and the self-bias change with time as the sputtering particles of the insulator MgO adhere to the inner wall of the chamber, the shield 7, the substrate holder 3 and the like, a bias potential outside the optimal range of the self-bias potential may be generated. In order to address this problem, the sputtering device 1 according to the present invention includes the variable impedance mechanism 4.

A matching method using the variable impedance mechanism 4 that is the main component of the present invention will be described. The variable impedance mechanism 4 is electrically connected to the electrode 13 disposed inside the substrate holder 3, and further, a high-frequency power supply 11 is connected to the variable impedance mechanism 4. Minute bias power is applied to the substrate holder 3 from the high-frequency power supply 11. Here, the applied bias voltage has such small power (preferably 1 to 10 W; in the present embodiment: 4 W) that does not destroy the forming film. The method is effective as means for increasing bias potential when sufficient ion assistance cannot be attained by the floating potential of the substrate mounting table itself of the substrate holder 3.

The input detector 10 detects the incident wave of the high-frequency power supply 11, and the reflected wave generated when matching cannot be established and thereby power is not consumed, and inputs them into the impedance control section 9. The impedance control section 9 controls the variable impedance mechanism 4 based on the values of the incident wave sent from the input detector and the reflected wave originating from the electrode side. More, specifically, the impedance control section 9 controls the variable impedance mechanism 4 by appropriately controlling ratios of capacitors C1 and C2 and coils L1 and L2 of the impedance matching circuit included in the variable impedance mechanism 4 so as not to detect the above-mentioned reflected wave. Note that, although only the capacitors C1 and C2 and the coils L1 and L2 are illustrated in FIG. 1A, it is possible to appropriately change in design selection and combination of capacitors C and coils L according to an embodiment. When the reflected wave is not detected and only the incident wave is detected, it is determined that matching is established in the variable impedance mechanism 4. That is, even if plasma impedance changes due to deposition of MgO film on the shield and the substrate holder, it is determined that self-bias can be induced stably on the substrate.

Thus, automatic matching can be established by steps of applying bias power (a progressive power wave) to the substrate 2 and controlling the variable impedance mechanism 4 based on detection of the reflected wave from the substrate 2. Control of the potential of the substrate 2 by the variable impedance mechanism 4 can optimize the incident energy of positive ions inflowing from plasma.

In some cases, in order to reduce a floor area occupied by the whole devices (a multi-chamber system 400 in FIG. 5)), the high-frequency sputtering device 1 may be provided with a plurality of targets in addition to the MgO target.

Moreover, as described in Japanese Patent Application No. 2007-34686, during forming MgO film, in order to absorb excessive oxygen and moisture in a vacuum chamber, the MgO film has to be formed in the vacuum chamber using, as a target, a substance having getter effect on an oxidizing gas greater than that of MgO. Here, the substance having getter effect on an oxidizing gas greater than that of MgO, is a metal or a semiconductor composed of Ta, Ti, Mg, Zr, Nb, Mo, W, Cr, Mn, Hf, V, B, Si, Al, or Ge.

However, if a film of a metal other than MgO (for example; Ta) is formed in the high-frequency sputtering device 1, not only the MgO film but also the Ta film will adhere to the shield 7 and the inner wall of the vacuum chamber 17. The shield 7 so called here is disposed so as to prevent a film from adhering to the vacuum chamber 17, and it can be replaced by a user of the device. The potential of the shield 7 will change with time due to the number of film forming times and adhesion of multiple films. Although, problems such as lacking homogeneity and uniformity of a film may occur by this, they can be solved if the high-frequency sputtering device 1 including the variable impedance mechanism 4 according to the present invention is used.

Second Embodiment

Figure 2:
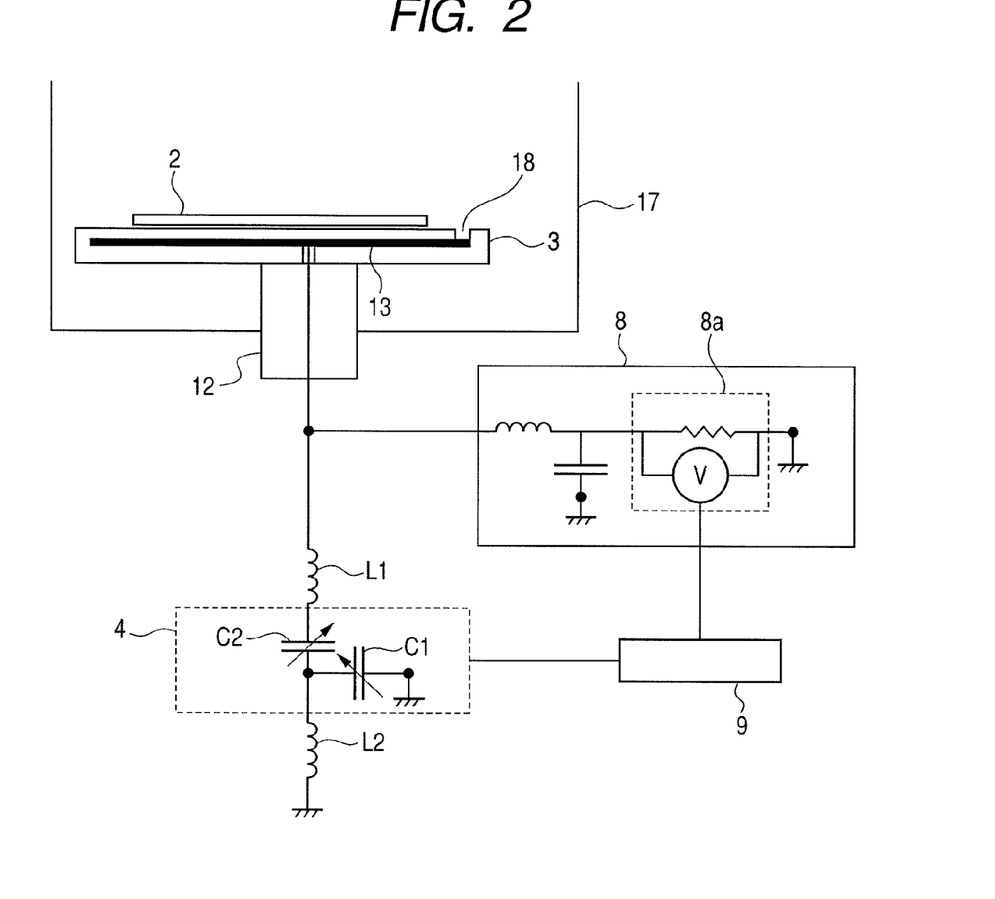
FIG. 2 is a diagram illustrating a second embodiment of a high-frequency sputtering device according to the present invention.

With reference to FIG. 2, the configuration of a high-frequency sputtering device according to the second embodiment will be described. As illustrated in FIG. 2, an electrode 13 is disposed inside a substrate holder 3 on which a substrate 2 is mounted. On the electrode 13, an inflow-electron detection sensor (Vdc detection sensor) 18 for detecting the value of current by taking in electrons flown from plasma is disposed. The inflow-electron detection sensor 18 is constituted by a hole formed so that the electrode 13 disposed inside the substrate holder 3 is exposed, and detects electrons by inflow of the electrons in plasma into the electrode 13 through the hole.

Here, Vdc is difference in a potential between those of a ground and a substrate, i.e., the self-bias applied to the substrate. The high-frequency sputtering device of the present embodiment is provided with an arithmetic circuit 8 including arithmetic section 8a for converting the current value detected by the inflow-electron detection sensor 18 into Vdc and an impedance control circuit section 9 that controls the impedance of a variable impedance mechanism 4 by arithmetic processing of Vdc signal from the arithmetic circuit 8. The variable impedance mechanism 4 includes an impedance matching circuit composed of combination of capacitors C and coils L, and is electrically connected to an electrode 13 disposed inside the substrate holder 3. Unlike the high-frequency sputtering device in the first embodiment, the high-frequency sputtering device in the second embodiment is not necessary to use a high-frequency power supply connected to the side of the substrate holder 3. Note that, although cathodes 14a and 14b, a high-frequency power supply 6, a DC power supply 16, a metal shield 7, targets 5a and 5b and a gas supply unit 15 are not illustrated in FIG. 2, they are also disposed therein like the high-frequency sputtering device 1 illustrated in FIG. 1.

Now, an operation of the high-frequency sputtering device according to the present embodiment will be described. The Vdc detection sensor 18 takes in inflow-electrons to the electrode 13 from plasma, and detects them as a current value. Only the DC current component of the detected (high-frequency) current value is taken out by an LC circuit of the Vdc arithmetic circuit 8, and Vdc is derived by the arithmetic section 8a based on Ohm's law. Based on the Vdc calculated by the Vdc arithmetic section 8a, the impedance control section 9 can adjust appropriately the ratios of the capacitors C1 and C2 and coils L1 and L2 constituting the variable impedance mechanism 4 to adjust the variable impedance 4 so that Vdc may be stabilized. That is, in the impedance control section 9, since an optimal Vdc is programmed in advance for each material of film formation or according to the thickness of a film formed by each of the film forming materials, the ratio of the capacitors C1 and C2 and the ratio of coils L1 and L2 can be adjusted so that the Vdc calculated by the Vdc arithmetic section 8a is adjusted to be an optimal one.

As described above, whenever a metal film and an insulating film are formed on the substrate 2, and further whenever the thickness of each of those films changes, the potential of the substrate, i.e. Vdc, will change with time. If Vdc exceeds the range (A<Vdc<B) in which a homogeneous film can be formed, a high-quality film can not be formed. Thus, the impedance control section 9 is configured to adjust appropriately the ratio of the capacitors C1 and C2 so that Vdc can be set within the range (A<Vdc<B) in which a homogeneous film can be formed. Note that, although only the capacitors C1 and C2 and the coils L1 and L2 are illustrated in FIG. 2, it is possible to appropriately change in design selection of capacitors C and coils L and their combination according to an embodiment. If the substrate has a large negative potential by changing impedance, the composition of the film will be destroyed by inflow ions. On the contrary, if the substrate potential comes too close to the ground, ion assistance will not be obtained, thereby disabling sufficient surface diffusion motion on the substrate of sputtering particles. An optimum impedance exists between the both of them. For example, when forming MgO film on a substrate on which a metal film is deposited, an ultra-thin MgO film in an initial stage of film formation acts as a large capacitance and a large bias potential is generated, and thereby the composition of the film may be destroyed by positive inflow-ions having high energy. As indicated by the present embodiment, if impedance can be optimized by automatically feedbacking it while monitoring a discharge parameter such as Vdc, the substrate potential that changes with time by gradual deposition of an insulating film on the conductive substrate 2 and conductive shield 7, i.e. Vdc, can be adjusted to be an optimum potential.

In addition, in order to measure Vdc, it is not always required to prepare the Vdc detection sensor 18 and the Vdc arithmetic circuit 8, and as another method Vdc may be measured by inserting a probe within the vacuum chamber.

Figure 3:
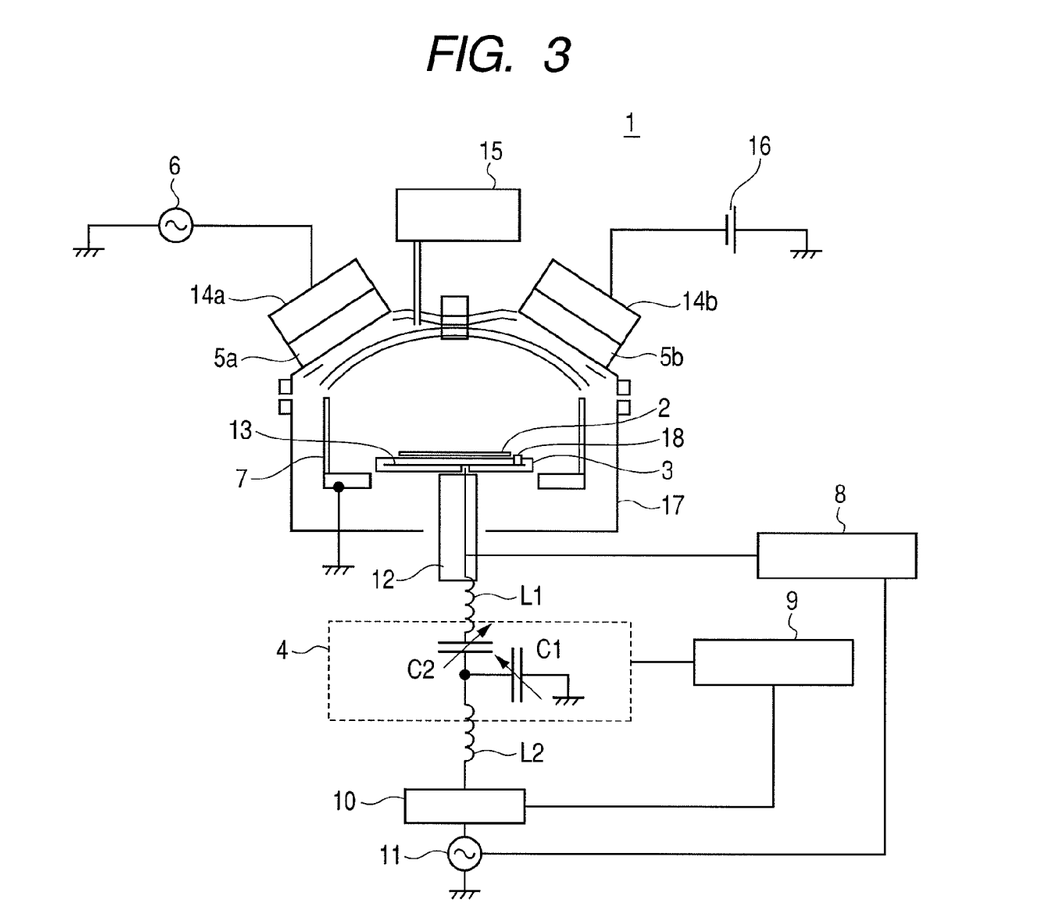
FIG. 3 is a diagram illustrating another embodiment of a high-frequency sputtering device according to the present invention.

Furthermore, a high-frequency sputtering device illustrated in FIG. 3 is combination of the high-frequency sputtering device illustrated in FIG. 1 and the high-frequency sputtering device illustrated in FIG. 2. That is, on an electrode 13 of the high-frequency sputtering device illustrated in FIG. 3, an inflow-electron detection sensor (Vdc detection sensor) 18 constituted by a hole formed so that the electrode 13 disposed inside a substrate holder 3 is exposed like in FIG. 2. The electrode 13 is electrically connected to a high-frequency power supply 11 constituted like in FIG. 1 through the arithmetic circuit 8 constituted like in FIG. 2. In this configuration, by controlling the bias power functioning while assisting ions and by controlling impedance, the self-bias Vdc can be set within the range (A<Vdc<B) in which a high-quality film can be formed. The other configuration is the same as that of the high-frequency sputtering device illustrated in FIG. 1.

Third Embodiment

Figure 4:
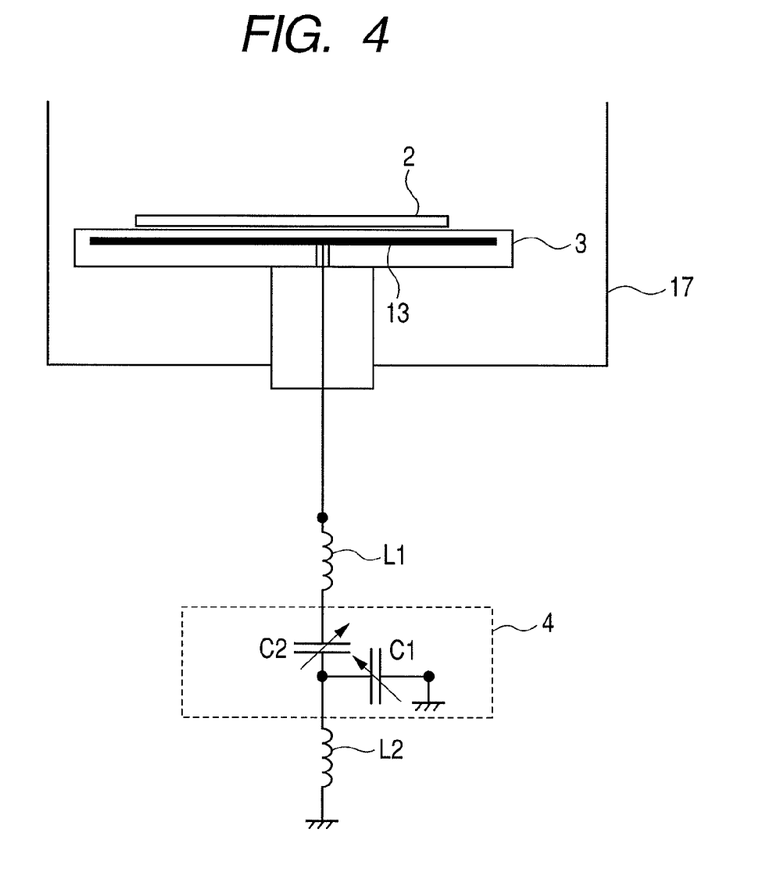
FIG. 4 is a diagram illustrating a third embodiment of a high-frequency sputtering device according to the present invention.

Now, with reference to FIG. 4, the configuration of a high-frequency sputtering device according to the third embodiment will be described. In the present embodiment also, a substrate 2 is placed on a substrate holder 3, and a variable impedance mechanism 4 including capacitors C1 and C2 and coils L1 and L2 is electrically connected to an electrode 13 disposed inside the substrate holder 3. The variable impedance mechanism 4 is grounded. Note that, in FIG. 3, although a vacuum chamber 17, cathodes 14a and 14b, a high-frequency power supply 6, a DC power supply 16, a metal shield 7, targets 5a and 5b, and a gas supply device 15 etc. are not illustrated, they are disposed therein like the high-frequency sputtering device 1 illustrated in FIG. 1. In addition, although only the capacitors C1 and C2 and the coils L1 and L2 are illustrated in FIG. 4, selection of capacitors C and coils L and their combination can be changed appropriately in design according to an embodiment. Even if the high-frequency power supply 11 and the arithmetic section 8 etc., are not present, a user of the device can change self bias (Vdc on the substrate) only by adjusting appropriately the ratio of the capacitors C1 and C2 and the ratio of the coils L1 and L2 constituting the impedance variable mechanism 4. However, since there are not a discharge parameter detection mechanism and a feedback circuit, in this case, only experimental tendency of film performance can be known.

Fourth Embodiment

Figure 5:
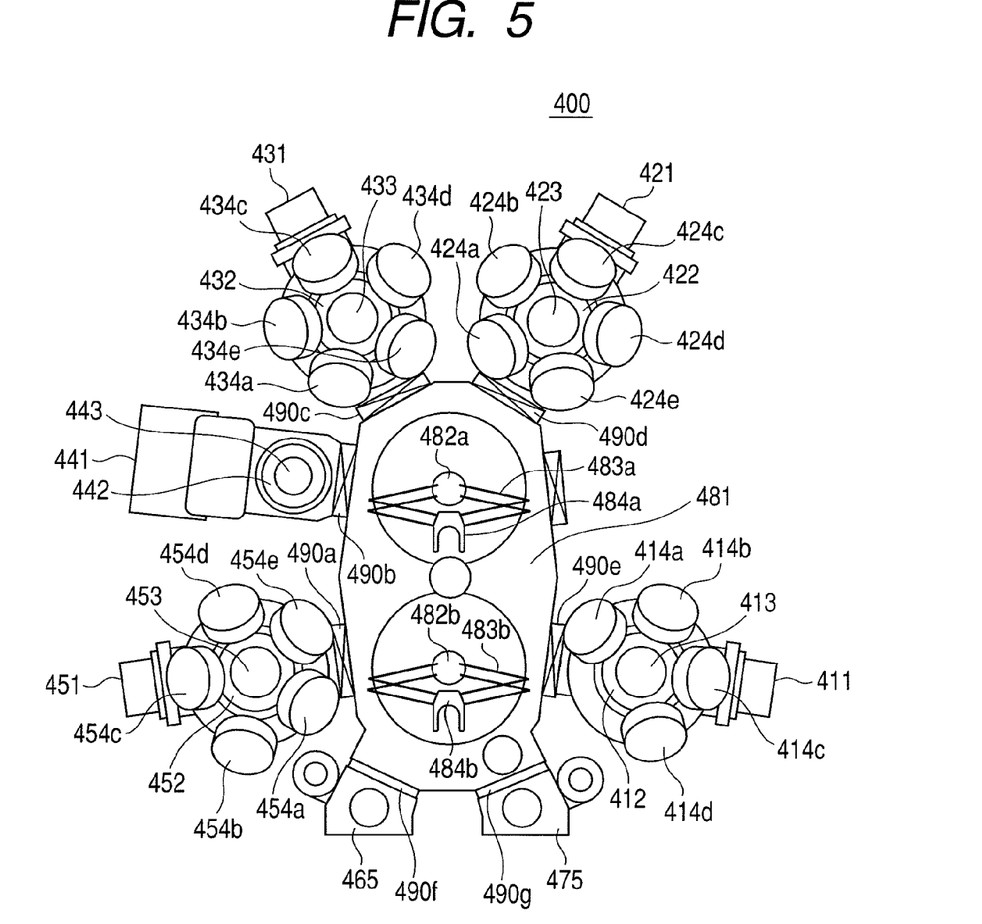
FIG. 5 is a schematic view of a multi-chamber system including a sputtering device according to the present invention.

A schematic configuration diagram of a multi-chamber system 400 for producing a tunnel magnetoresistive thin film including the above-mentioned high-frequency sputtering device 1 is illustrated in FIG. 5. The multi-chamber system 400 is a cluster type system, and includes a plurality of vacuum processing chambers 411, 421, 431, 441 and 451. A vacuum substrate transfer chamber 481 provided with vacuum transfer robots 482a and 482b is disposed in a central position of the system. The vacuum transfer robots 482a and 482b are provided with retractable arms 483a and 483b and hands 484a and 484b for mounting a substrate thereon, respectively. The base section of each of the arms 483a and 483b is rotatably attached to the vacuum substrate transfer chamber 481. Load lock chambers 465 and 475 are disposed inside the vacuum substrate transfer chamber 481 of the multi-chamber system 400 illustrated in FIG. 5. The load-lock chambers 465 and 475 transfer a substrate to be processed to the multi-chamber system 400 from outside and transfer the substrate on which multiple-layer magnetic films have been formed from the system 400 to the outside. Between the vacuum substrate transfer chamber 481 and each of the load-lock chambers 465 and 475, gate valves 490f and 490g which separate each of the chambers and can be opened and closed if necessary are disposed, respectively. In the multi-chamber system 400 illustrated in FIG. 5, four film formation chambers 411, 421, 431 and 451 and one preprocessing chamber 441 are disposed around the vacuum substrate transfer chamber 481. Between the chamber 481 and each of the processing chambers, gate valves 490a to 490e which separate both chambers and can be opened and closed if necessary are disposed, respectively. Note that, although each of the chambers is provided with vacuum evacuation means, gas introduction means, electric power supply means and so on, they are not illustrated in the figure. Each of the sputtering film formation chambers 411, 421, 431 and 451 of the multi-chamber system 400 illustrated in FIG. 5, is a film formation chamber for continuously forming multiple films constituting a magnetoresistive element in the same chamber and it is provided with at least one target and one sputtering cathode.

In the sputtering chamber 411, a Ta target 414a and an MgO target 414b are disposed at the ceiling through respective sputtering cathodes not illustrated in the figure, with respect to a substrate 413 placed on a substrate holder 412 at the center of the bottom of the chamber. In addition, as illustrated in FIG. 5, targets 414c and 414d can also be disposed in the sputtering chamber 411, and they can also be suitably used according to an embodiment. Between the vacuum substrate transfer chamber 481 and the sputtering chamber 411, the gate valve 490e which separates the both chambers and can be opened and closed if necessary, is disposed.

In the sputtering chamber 421, an Ru target 424a, an IrMn target 424b, a 70CoFe target 424c and a CoFeB target 424d are disposed at the ceiling through respective sputtering cathodes not illustrated in the figure, with respect to a substrate 423 placed on a substrate holder 422 at the center of the bottom of the chamber. Note that, as illustrated in FIG. 5, a target 424e can also be disposed inside the sputtering chamber 421, and it can also be suitably used according to an embodiment. Between the vacuum substrate transfer chamber 481 and the sputtering chamber 421, the gate valve 490d which separates the both chambers and can be opened and closed if necessary, is disposed.

In the sputtering chamber 431, a Ta target 434a and a Cu target 434b are disposed through respective sputtering cathodes not illustrated in the figure, with respect to a substrate 433 placed on a substrate holder 432 at the center of the bottom of the chamber. Note that, as illustrated in FIG. 5, targets 434c, 434d and 414e can also be disposed inside the sputtering chamber 431, and they can also be suitably used according to an embodiment. Between the vacuum substrate transfer chamber 481 and the sputtering chamber 431, the gate valve 490c which separates the both chambers and can be opened and closed if necessary, is disposed.

In the preprocessing chamber 441, preprocessing such as substrate cleaning of a substrate before film deposition is carried out by physical etching with respect to a substrate 443 placed on a substrate holder 442 at the center of the bottom of the chamber. Between the vacuum substrate transfer chamber 481 and the preprocessing chamber 441, the gate valve 490b which separates the both chambers and can be opened and closed if necessary, is disposed.

In the sputtering chamber 451, a CoFeB target 454a, a Ta target 454b, a Cu target 454c and an Ru target 454d are disposed at the ceiling through respective sputtering cathodes not illustrated in the figure, with respect to a substrate 453 placed on a substrate holder 452 at the center of the bottom of the chamber. Note that, as illustrated in FIG. 5, a target 454e can also be disposed inside the sputtering chamber 451, and it can also be suitably used according to an embodiment. Between the vacuum substrate transfer chamber 481 and the sputtering chamber 451, the gate valve 490a which separates the both chambers and can be opened and closed if necessary, is disposed.

All chambers except for the load-lock chambers 465 and 475 are vacuum chambers each being at a pressure of $1 \times 10^{-6}$ Pa or less, and substrate transfer between each of the vacuum chambers is carried out in a vacuum by the vacuum transfer robots 482a and 482b. A substrate for forming a spin valve type tunnel magnetoresistive thin film thereon is placed in the load-lock chamber 465 or 475 which is initially caused to be at the atmospheric pressure, and after the load-lock chamber 465 or 475 is evacuated, the substrate is transferred into a desired vacuum chamber by the vacuum transfer robots 482a and 482b.

Figure 6:
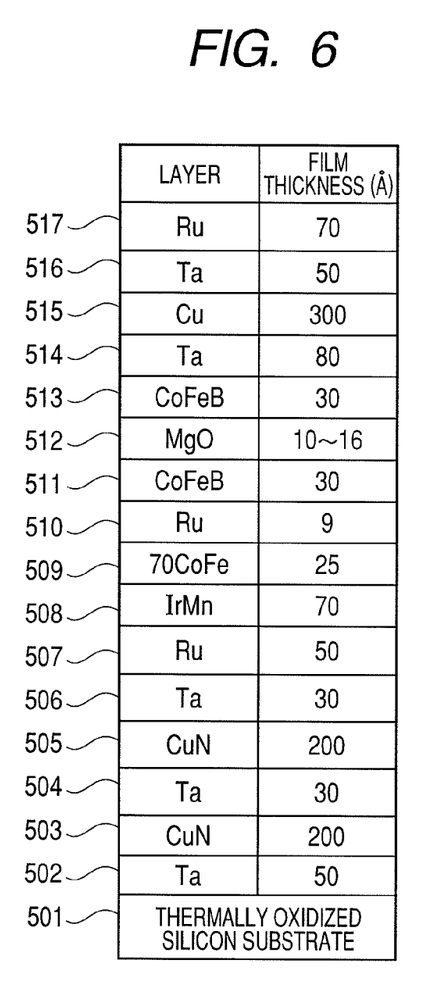
FIG. 6 is a schematic view of a magnetoresistive thin film produced by a sputtering device according to the present invention.

In a fundamental film configuration, as illustrated in FIG. 6, an antiferromagnetic combination including: Ta film 502 (50 Å)/CuN film 503 (200 Å)/Ta film 504 (30 Å)/CuN film 505 (200 Å)/Ta film 506 (30 Å) as an lower electrode layer; Ru film 507 (50 Å) as a seed layer; IrMn film 508 (70 Å) as an antiferromagnetic layer; and CoFe film 509 (25 Å)/Ru film 510 (9 Å)/CoFeB film 511 (30 Å) as a magnetization fixing layer, is used, and MgO film 512 (10-16 Å) is used as a tunnel barrier layer. As a magnetization free layer, CoFeB film 513 (30 Å) is formed. Finally, a stacked structure of Ta film 514 (80 Å)/Cu film 515 (300 Å)/Ta film 516 (50 Å)/Ru film 517 (70 Å) is used as an upper electrode.

In order to efficiently form a film having such a configuration, MgO for a tunnel barrier layer and Ta for producing a pure atmosphere are disposed inside the sputtering chamber 411; Ru, IrMn, CoFe and CoFeB are disposed inside the sputtering chamber 421; Ta and Cu are disposed inside the sputtering chamber 431; and CoFeB, Ta, Cu and Ru are disposed inside the sputtering chamber 451 as sputtering targets. Initially, a substrate is transferred into the preprocessing chamber 441 and the surface layer polluted in the atmosphere is physically removed by about 2 nm by etching of reverse sputtering. Then, the substrate is transferred into the sputtering chamber 431 where the lower electrode layer composed of Ta film 502, CuN film 503, Ta film 504, CuN film 505, and Ta film 506 is formed thereon. Then, the substrate is transferred into the sputtering chamber 421 where the seed layer composed of Ru film 507, and the antiferromagnetic combination layer composed of IrMn film 508, CoFe film 509, Ru film 510, and CoFeB film 511 are formed thereon, and then transferred into the sputtering chamber 411 where tunnel barrier layer MgO film 512 (film thickness of 10-16 Å) is formed thereon. Here, by forming the tunnel barrier layer MgO film 512 using the above-mentioned oblique sputtering method, very thin MgO film having a thickness of 10-16 Å can be obtained. After the tunnel barrier layer is formed thereon, the substrate is transferred into the sputtering chamber 451 where the magnetization free layer composed of CoFeB film 513 and the upper electrode layer composed of Ta film 514, Cu film 515, Ta film 516, and Ru film 517 are formed thereon, and then the substrate is returned to the load-lock chamber 465 or 475.

The produced tunnel magnetoresistive thin film is loaded into an annealing furnace in a magnetic field and subjected to annealing processing in a vacuum at a desired temperature and time while being applied with a magnetic field having strength of 8 kOe or more, of which direction is parallel to one direction. The magnetoresistive thin film completed in this manner is illustrated in FIG. 6. When a magnetoresistive thin film having MgO film as the tunnel barrier layer 512 is formed using the multi-chamber system 400, a high performance magnetoresistive thin film can be obtained by forming the MgO tunnel barrier layer 512 using the high-frequency sputtering device 1 illustrated in FIG. 1.

Using a tunnel magnetoresistive thin film illustrated in FIG. 6, an MTJ device such as a magnetic reproducing head, an MRAM and a magnetic sensor, can be manufactured.

Figure 7:
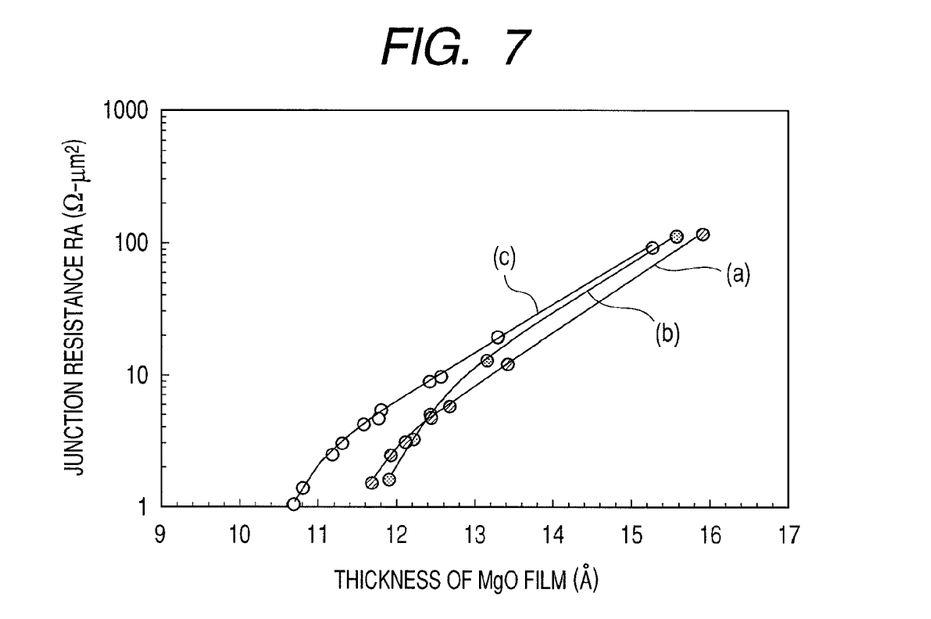
FIG. 7 is a graph showing a relationship between the thickness and the junction resistance of an MgO film formed using a sputtering device according to the present invention.
Figure 8:
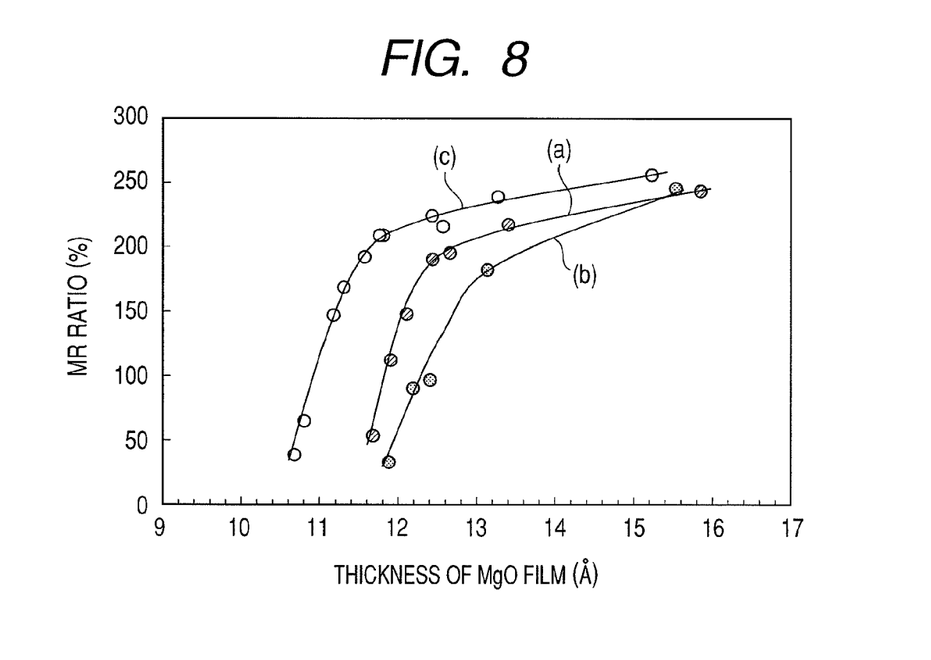
FIG. 8 is a graph showing a relationship between the thickness and the rate of magnetoresistance change of an MgO film formed using a sputtering device according to the present invention.
Figure 9:
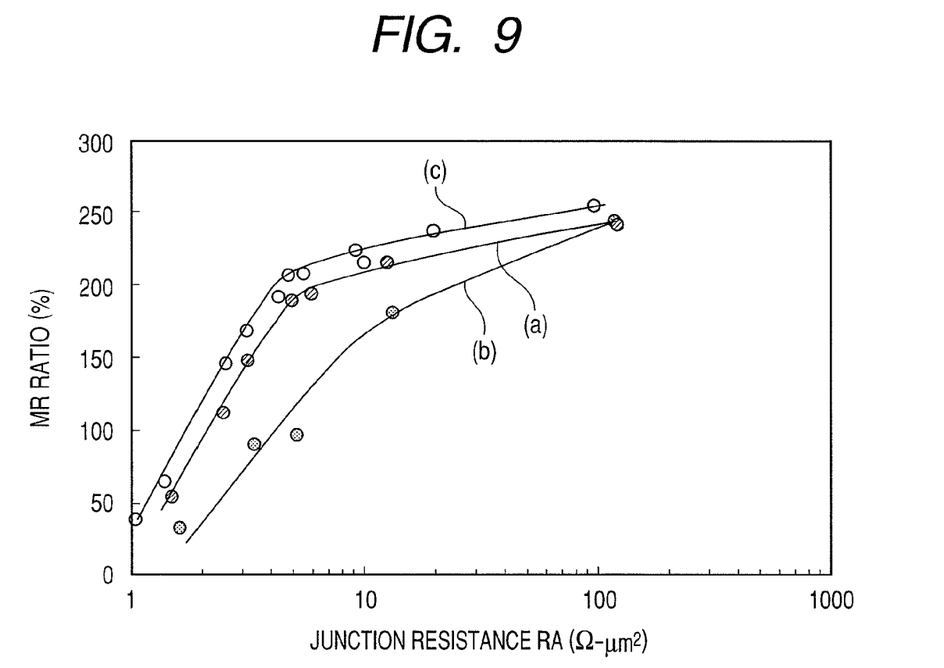
FIG. 9 is a graph showing a relationship between the junction resistance and the rate of magnetoresistance change of an MgO film formed using a sputtering device according to the present invention.

When the tunnel magnetoresistive thin films 500 in FIG. 6 are formed using the multi-chamber system 400 illustrated in FIG. 5 and further, by forming the MgO tunnel barrier layer 512 in the high-frequency sputtering device 1 illustrated in FIG. 1, the performances of each of thin films 500 were compared by changing the variable impedance mechanism 4. Junction resistance was changed by changing the thickness of the MgO tunnel barrier layer 512. In FIGS. 7 to 9, measurement results are illustrated in cases of: a) power is not supplied from a high-frequency power supply and capacitance ratio C1/C2 in a variable impedance mechanism is fixed; b) power is not supplied from a high-frequency power supply and capacitance ratio C1/C2 in the variable impedance mechanism is fixed to a value that is different from that of case a); and c) a variable impedance mechanism is automatically adjusted in the second embodiment illustrated in FIG. 2. In case b), the capacitance ratio C1/C2 is set so that the capacitance component in the load side impedance is larger than that of case a).

FIG. 7 is a graph illustrating the relationship between the thickness (Å) and the junction resistance (RA) (O·μm$^2$) of MgO film, it is indicated that RA can be reduced by reducing the thickness of MgO film. In cases a) and b), measurement results when capacitance ratio C1/C2 in a variable impedance mechanism is fixed are illustrated; and in case c), measurement results when the capacitance ratio C1/C2 is adjusted automatically are illustrated. In case b), the capacitance component in the load side impedance is set to be larger than that in case a). In all cases a) to c), as the thickness of MgO film is reduced, RA also decreases. However, in case c), more higher RA can be obtained under a same thickness of the MgO film than cases a) and b). This means that in case c), that is, the MgO film produced while capacitance ratio C1/C2 is adjusted automatically within a variable impedance mechanism, has the film quality of which is improved as compared with cases a) and b) in which capacitance ratio is fixed. The film quality is determined by the quantity of defects contained in the MgO film and unevenness of the film etc., and as the film quality improves larger RA can be obtained. Since in case b), the capacitance component in a load side impedance and the negative potential on a substrate are larger than those of case a), it is considered that high-energy Ar ions flowed in a film and caused breakage of the film composition and degradation of the performance.

FIG. 8 is a graph illustrating the relationship between the thickness and the rate of magnetoresistance change (MR ratio) of MgO film, in all cases of a) to c), it is indicated that as the thickness of the MgO film is reduced MR ratio also decreases. In cases a) and b), measurement results when the capacitance ratio C1/C2 in the variable impedance mechanism is fixed are illustrated, and in case c), measurement results when the capacitance ratio C1/C2 in the variable impedance mechanism is automatically adjusted are illustrated. In case b), the capacitance component in the load side impedance is set to be larger than that of case a). MR ratio was about 250% within a thickness range of 15 to 16 Å in all cases a) to c) and no difference in MR ratio appeared, however, in a thin film range below this range, significant difference in MR ratio appeared between these cases. In case c) where C1/C2 ratio was automatically adjusted, highest MR ratio was maintained in spite of film thickness change, compared with those in cases a) and b). Furthermore, even for such a thin film that MR ratio was not obtained in cases a) and b), MR ratio was obtained in case c). For example, when the thickness of MgO film is about 11 Å, in cases a) and b), MR ratio was not obtained, however, in case c), MR ratio of an order of 150% was obtained. The reason is that the energy of positive ions flowing into a substrate was controlled by adjusting the substrate potential so as to be always an optimum value and high quality MgO film was able to be formed from the initial stage of its growth without damage.

FIG. 9 is a graph illustrating the relationship between junction resistance (RA) and rate of magnetoresistance change (MR ratio), in all cases a) to c), it is indicated that as RA is reduced MR ratio also decreases. In cases a) and b), measurement results when the capacitance ratio C1/C2 in the variable impedance mechanism is fixed are illustrated, and in case c), measurement results when the capacitance ratio C1/C2 in the variable impedance mechanism is automatically adjusted are illustrated. In case b), the capacitance component in the load side impedance is set to be larger than that in case a). As illustrated in FIG. 7, reduction of RA is achieved by reducing the thickness of MgO film, and as illustrated in FIG. 8, reduction of MR ratio is also achieved by reducing the thickness of the MgO film, however, this figure illustrates the relationship between RA and MR ratio without intervening the thickness of the MgO film. In case c), even when RA is reduced, MR ration can be maintained to be a higher value than those in cases a) and b). Control of the variable impedance mechanism 4 so as to adjust the substrate potential to be always optimum value, enables high MR ratio and low RA to be compatible.

The embodiments mentioned above do not limit the scope of the present invention, they can be suitably changed based on teaching or suggestion of the present embodiment so as to achieve the content of a main subject of the claims of the present invention.

What is claimed is:

1. A high-frequency sputtering device comprising:
   a chamber;
   a gas evacuation unit that evacuates an inside atmosphere of the chamber;
   a gas supply unit that supplies a gas into the chamber;
   a substrate holder having a floating potential and provided with a substrate mounting surface for mounting a substrate;
   a sputtering cathode provided with a target mounting table for sputtering an insulator target on the target mounting table by applying a high-frequency power to the gas to generate a plasma of the gas;
   an electrode disposed inside the substrate holder and extending along the substrate mounting surface;
   a variable impedance for adjusting a substrate potential, one end of the variable impedance being electrically connected to the electrode and another end of the variable impedance being grounded;
   an inflow-electron detection sensor disposed inside the substrate holder and exposed to a space in which the plasma is generated through an opening formed on the substrate holder;
   an arithmetic circuit configured to derive a potential of the substrate on the basis of DC level in a current from the inflow-electron detection sensor; and
   a control circuit configured to control the variable impedance so that the substrate potential is within a predetermined range according to the derived substrate potential,
   wherein a part of the electrode at the opening forms the inflow-electron detection sensor, and
   wherein the substrate holder is not electrically connected to a high-frequency power supply.

2. A high-frequency sputtering device according to claim 1, wherein
   a current from the inflow-electron detection sensor is incorporated into a current of the electrode; and
   the arithmetic circuit is further configured to derive a substrate potential on the basis of the DC component of the combined current from the electrode.

3. A high-frequency sputtering device according to claim 1, wherein the control circuit has a predetermined optimum value of a substrate potential programmed thereinto, and controls the variable impedance so that the derived substrate potential becomes the predetermined optimum value of a substrate potential.

4. A high-frequency sputtering device according to claim 1, further comprising: a rotation drive unit that rotates the substrate holder.

5. A high-frequency sputtering device according to claim 1, wherein the sputtering cathode is arranged such that a surface of the target mounting table is non-parallel to the substrate mounting surface.

* * * * *